US008878350B1

(12) United States Patent
Sridharan et al.

(10) Patent No.: US 8,878,350 B1
(45) Date of Patent: Nov. 4, 2014

(54) SEMICONDUCTOR DEVICE HAVING A BUFFER MATERIAL AND STIFFENER

(71) Applicant: Maxim Integrated Products, Inc., San Jose, CA (US)

(72) Inventors: Vivek S. Sridharan, Addison, TX (US); Amit S. Kelkar, Flower Mound, TX (US); Peter R. Harper, Gilroy, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/026,015

(22) Filed: Sep. 13, 2013

Related U.S. Application Data

(60) Provisional application No. 61/811,352, filed on Apr. 12, 2013.

(51) Int. Cl.
*H01L 23/22* (2006.01)
*H01L 23/06* (2006.01)
*H01L 23/00* (2006.01)

(52) U.S. Cl.
CPC ............... *H01L 24/26* (2013.01); *H01L 24/83* (2013.01)
USPC ........... 257/684; 257/687; 257/698; 257/730; 257/737; 257/738; 438/118; 438/126

(58) Field of Classification Search
USPC ................. 257/684, 687, 698, 730, 737, 738; 438/118, 126
See application file for complete search history.

(56) References Cited

U.S. PATENT DOCUMENTS

| 8,288,202 | B2* | 10/2012 | Lee et al. ........... | 438/107 |
|---|---|---|---|---|
| 2011/0024888 | A1* | 2/2011 | Pagaila et al. ......... | 257/686 |
| 2011/0147871 | A1* | 6/2011 | Utsumi et al. .......... | 257/432 |
| 2012/0018899 | A1* | 1/2012 | Pagaila et al. ......... | 257/774 |
| 2014/0061888 | A1* | 3/2014 | Lin et al. ........... | 257/690 |
| 2014/0103523 | A1* | 4/2014 | Jang et al. .......... | 257/737 |
| 2014/0138817 | A1* | 5/2014 | Paek et al. .......... | 257/737 |
| 2014/0167263 | A1* | 6/2014 | Wu et al. ........... | 257/741 |
| 2014/0170816 | A1* | 6/2014 | Nah et al. .......... | 438/126 |

* cited by examiner

*Primary Examiner* — Ngan Ngo
(74) *Attorney, Agent, or Firm* — Advent, LLP

(57) ABSTRACT

Semiconductor devices are described that include a semiconductor device having multiple, stacked die on a substrate (e.g., a semiconductor wafer). In one or more implementations, wafer-level package devices that employ example techniques in accordance with the present disclosure include an ultra-thin semiconductor wafer with metallization and vias formed in the wafer and an oxide layer on the surface of the wafer, an integrated circuit chip placed on the semiconductor wafer, an underfill layer between the integrated circuit chip and the semiconductor wafer, a buffer material formed on the semiconductor wafer, the underfill layer, and at least one side of the integrated circuit chip, an adhesive layer placed on the buffer layer and the integrated circuit chip, and a stiffener layer placed on the adhesive layer. The semiconductor device may then be segmented into individual semiconductor chip packages.

20 Claims, 4 Drawing Sheets

SEMICONDUCTOR DEVICE HAVING A BUFFER MATERIAL AND STIFFENER

CROSS-REFERENCE TO RELATED APPLICATIONS

The present application claims the benefit under 35 U.S.C. §119(e) of U.S. Provisional Application Ser. No. 61/811,352, filed Apr. 12, 2013, and titled "SEMICONDUCTOR DEVICE HAVING A BUFFER MATERIAL AND STIFFENER." U.S. Provisional Application Ser. No. 61/811,352 is herein incorporated by reference in its entirety.

BACKGROUND

Consumer electronic devices, in particular, mobile electronic devices such as smart phones, tablet computers, and so forth, increasingly employ smaller, more compact components to furnish their users with desired features. Such devices often employ three dimensional integrated circuit devices (3D IC). Three-dimensional integrated circuit devices are semiconductor devices that employ two or more layers of active electronic components. Through-silicon vias (TSV) interconnect electronic components on the different layers (e.g., different substrates) of the device allowing the devices to be integrated vertically as well as horizontally. Consequently, three-dimensional integrated circuit devices can provide increased functionality within a smaller, more compact footprint than do conventional two-dimensional integrated circuit devices.

SUMMARY

Semiconductor devices are described that include a semiconductor device having multiple, stacked die on a substrate (e.g., a semiconductor wafer) that include the removal of oxide on the dicing streets, a buffer material between the semiconductor wafer and adhesive layer, and including an underfill layer with a coefficient of thermal expansion (CTE) matched to the CTE of the buffer material. In one or more implementations, wafer-level package devices that employ example techniques in accordance with the present disclosure include an ultra-thin semiconductor wafer with metallization and vias formed in the wafer and an oxide layer on the surface of the wafer, an integrated circuit chip placed on the semiconductor wafer, an underfill layer between the integrated circuit chip and the semiconductor wafer, a buffer material formed on the semiconductor wafer, the underfill layer, and at least one side of the integrated circuit chip, an adhesive layer placed on the buffer layer and the integrated circuit chip, and a stiffener layer placed on the adhesive layer. The semiconductor device may subsequently be segmented into individual semiconductor chip packages.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1:
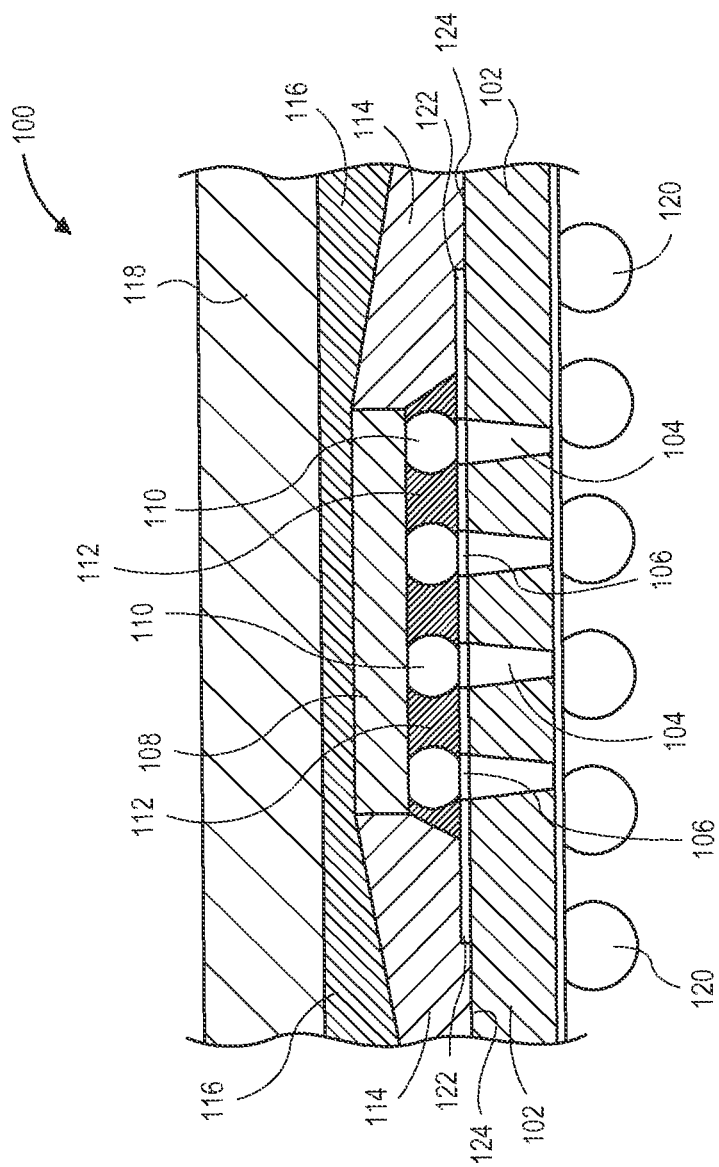
FIG. 1 is a diagrammatic partial cross-sectional view illustrating a semiconductor device at wafer level (e.g., prior to singulation of the device) in accordance with an example implementation of the present disclosure.

Three-dimensional integrated circuit devices are commonly manufactured using die-on-wafer techniques wherein electronic components (e.g., circuits) are first fabricated on two or more semiconductor wafers. The individual die are aligned on and attached to semiconductor wafers and segmented to provide individual devices. Through-silicon vias (TSVs) can be built into wafers before they are attached or created in the wafer stack after attachment. However, wafer warpage and bowing of the semiconductor wafer may occur during fabrication of three-dimensional integrated circuit devices. This wafer warpage can prevent effective wafer handling as well as mechanical failure within the device, for example, causing delamination of layers within the device. Also, device packages that include through-silicon vias (TSVs) with thin silicon, chip-to-wafer bonding using a mold compound are highly susceptible to thermo-mechanical failure. Additionally, a semiconductor wafer may be segmented into individual dice and may chip on the backside and crack along the die edges during the singulation process. Further, materials with dissimilar coefficients of thermal expansion can cause device failures, for example chip-to-wafer solder joint cracking. These problems increase the cost of the devices and reduce device yield.

Accordingly, techniques are described for fabricating semiconductor devices having multiple, stacked die on a substrate (e.g., a semiconductor wafer) that include the removal of oxide on the dicing streets, a buffer material between the semiconductor wafer and adhesive layer, and including an underfill layer with a coefficient of thermal expansion (CTE) matched to the CTE of the buffer material. In one or more implementations, wafer-level package devices that employ example techniques in accordance with the present disclosure include an ultra-thin semiconductor wafer with metallization and vias formed in the wafer and an oxide layer on the surface of the wafer; an integrated circuit chip placed on the semiconductor wafer; an underfill layer between the integrated circuit chip and the semiconductor wafer; a buffer material formed on the semiconductor wafer, the underfill layer, and at least one side of the integrated circuit chip; an adhesive layer placed on the buffer layer and the integrated circuit chip; and a stiffener layer placed on the adhesive layer.

In implementations, a wafer-level package device that employs example techniques in accordance with the present disclosure includes placing an integrated circuit chip on a processed semiconductor wafer, where the semiconductor wafer includes at least one via and at least one dielectric layer, forming an underfill material layer between the integrated circuit chip and the semiconductor wafer, forming a buffer material layer on a portion of the underfill material layer, the dielectric layer, the semiconductor wafer, and adjacent to at least one side of the integrated circuit chip, forming an adhesive layer on the buffer material layer and a portion of the integrated circuit chip, placing a stiffener layer on the adhesive layer, and forming at least one solder bump on the semiconductor wafer. The processed semiconductor wafer may then be segmented into individual semiconductor devices.

Example Implementations

FIG. 1 illustrates a semiconductor device 100 in accordance with example implementations of the present disclosure. As shown, the semiconductor device 100 is illustrated at wafer level prior to singulation. The semiconductor device 100 can include a semiconductor wafer 102. The semiconductor wafer 102 includes one or more integrated circuits (not shown), which are formed within the semiconductor wafer 102. The semiconductor wafer 102 includes a first (e.g., top or front) surface and a second (e.g., bottom or backside) surface. The integrated circuits are formed (e.g., fabricated) proximate to the first surface of the semiconductor wafer 102. The second surface of the semiconductor wafer 102 may be configured to have at least one solder bump 120 formed thereon or attached thereto. It is contemplated that the first and/or the second surface of the semiconductor wafer 102 may be planarized or unplanarized.

The semiconductor wafer 102 includes a base material utilized to form one or more integrated circuit devices through various fabrication techniques such as photolithography, ion implantation, deposition, etching, and so forth. The semiconductor wafer 102 may be configured in a variety of ways. For example, the semiconductor wafer 102 may comprise an n-type silicon wafer or a p-type silicon wafer. In an implementation, the semiconductor wafer 102 may comprise group V elements (e.g., phosphorus, arsenic, antimony, etc.) configured to furnish n-type charge carrier elements. In another implementation, the semiconductor wafer 102 may comprise group IIIA elements (e.g., boron, etc.) configured to furnish p-type charge carrier elements. In some embodiments, the semiconductor wafer 102 includes an ultra-thin semiconductor wafer with a thickness of less than about 100 μm. Further, the integrated circuits may be configured in a variety of ways. For example, the integrated circuits may include digital integrated circuits, analog integrated circuits, mixed-signal circuits, and so forth. In one or more implementations, the integrated circuits may include digital logic devices, analog devices (e.g., amplifiers, etc.), combinations thereof, and so forth. As described above, the integrated circuits may be fabricated utilizing various fabrication techniques. For example, the integrated circuits may be fabricated via complimentary metal-oxide-semiconductor (CMOS) techniques, bi-polar semiconductor techniques, and so on.

As shown in FIG. 1, the semiconductor device 100 also includes at least one through-silicon via 104 formed in the semiconductor wafer 102. Each through-silicon via 104 ("TSV") extends through the semiconductor wafer 102 between a contact pad 106 on the first side to a contact pad 106 on the second side. As illustrated in FIG. 1, the through-silicon via 104 includes a conductive material that furnishes an electrical interconnection between the first side and the second side of the semiconductor wafer 102. In one or more implementations, the conductive material included in the through-silicon via 104 may include a metal material (e.g., copper, aluminum, etc.). In embodiments, a contact pad 106 may include a metal pad or surface configured to furnish an electrical connection between two components (e.g., a solder bump, a redistribution layer, etc.). In some implementations, the contact pad 106 is not disposed directly over the through-silicon via 104. In these implementations, the contact pad 106 and the through-silicon via 104 are offset from each other and are electrically coupled using a backside redistribution layer (BRDL).

Additionally, the semiconductor wafer 102 includes a dielectric layer 122. In some implementations, the dielectric layer 122 includes an oxide layer. The dielectric layer 122 may be disposed on at least one side of the semiconductor wafer 102 while not covering a portion of the semiconductor where a dicing street 124 is located. A dicing street 124 may include an area where a portion of a wafer level package (e.g., between integrated circuits formed in the wafer) is cut away in order to segment the chip packages. In embodiments, the dicing street 124 is located at the edge of the semiconductor wafer 102 where the semiconductor device 100 will be singulated into individual chip packages. By removing and/or not forming the dielectric layer 122 on the dicing street(s) 124, wafer chipping during a singulation process and potential oxide layer delamination is prevented.

The semiconductor device 100 includes an integrated circuit chip 108 attached to one side of the semiconductor wafer 102. In embodiments, the integrated circuit chip 108 includes at least one solder bump 110 (e.g., a chip-to-wafer solder ball) that functions as an electrical connection between the integrated circuit chip 108 and the electrical interconnections of the semiconductor wafer 102. In other embodiments, the integrated circuit chip 108 may be attached to the semiconductor wafer 102 using other methods, such as using an adhesive. Additionally, the integrated circuit chip 108 may be electrically connected to the semiconductor wafer 102, for example, using bonding wires. In some implementations, the integrated circuit chip 108 may include a flip-chip where solder bumps are deposited on the integrated circuit chip 108 and the integrated circuit chip 108 is flipped over so that its top side faces down and is in contact with the semiconductor wafer 102.

The semiconductor device 100 includes an underfill 112 disposed between the integrated circuit chip 108 and the dielectric layer 122 on the semiconductor wafer 102. The underfill 112 may include a non-conductive material (e.g., an epoxy-based resin, etc.) that functions to protect the solder bumps 110 and a portion of the integrated circuit chip 108 from stress, moisture, contaminants, and other environmental hazards. In embodiments, the underfill 112 coefficient of thermal expansion (CTE) is matched to be similar to the CTE of the solder bumps 110 on the integrated circuit chip 108 and the CTE of the buffer material 114. The underfill 112 with the matched CTE functions to eliminate solder joint fatigue and/or cracking.

As illustrated in FIG. 1, the semiconductor device 100 includes a buffer material 114. In embodiments, the buffer material 114 includes an epoxy-based material that provides a thermo-mechanical buffer between the semiconductor wafer 102 and the adhesive 116. The buffer material 114 is formed on a portion of the semiconductor wafer 102, the dielectric layer 122, the underfill layer 112, and at least one side of the integrated circuit chip 108, as shown in FIG. 1. In implementations, the buffer material 114 includes a material having an intermediate CTE (e.g., a CTE between the CTE of the solder bumps 110 and the adhesive 116. In one embodiment, the buffer material 114 includes a liquid epoxy-based material. The buffer material 114 with the intermediate CTE provides a thermo-mechanical buffer and better dicing and temperature cycling performance.

The semiconductor device 100 includes an adhesive 116, as shown in FIG. 1. The adhesive is formed on the buffer material 114 and the integrated circuit chip 108. The adhesive material 128 is configured to bond a stiffener layer 118 to the semiconductor device 100. In implementations, the adhesive material 128 has a high CTE (e.g., greater than about 100 ppm/C), a low glass transition temperature (e.g., less than about 100° C.), and a low flex modulus (e.g., less than about 1 GPa).

Additionally, a stiffener layer 118 may be attached to the adhesive 116, as illustrated in FIG. 1. The stiffener layer 118 can function to structurally and environmentally protect the semiconductor device 100. In embodiments, the stiffener layer 118 may include a silicon layer (e.g., a silicon wafer). In other embodiments, the stiffener layer 118 may include another alloy or support material. In embodiments, the stiffener layer 118 includes a material with a high modulus or mechanical strength to prevent wafer warpage (e.g. less than about 1 mm).

The semiconductor device 100 includes at least one solder bump 120 formed on a side of the semiconductor wafer 102. Solder bumps 120 are provided to furnish mechanical and/or electrical interconnection between the semiconductor wafer 102 and corresponding pads (not shown) formed on the surface of a printed circuit board (not shown) or other semiconductor device. In one or more implementations, the solder bumps 120 may be fabricated of a lead-free solder such as a Tin-Silver-Copper (Sn—Ag—Cu) alloy solder (i.e., SAC), a Tin-Silver (Sn—Ag) alloy solder, a Tin-Copper (Sn—Cu) alloy solder, and so on. In one specific implementation, at least one solder bump 120 is electrically coupled to the through-silicon via 104 by way of a redistribution layer (e.g., front side redistribution layer).

Once the fabrication is complete, suitable wafer-level packaging processes may be employed to segment and package the semiconductor device 100. In one or more implementations, the segmented semiconductor devices may comprise wafer chip-scale package devices, which may further be attached to another device (e.g., a printed circuit board) to create an electronic device.

Example Fabrication Processes

Figure 2:
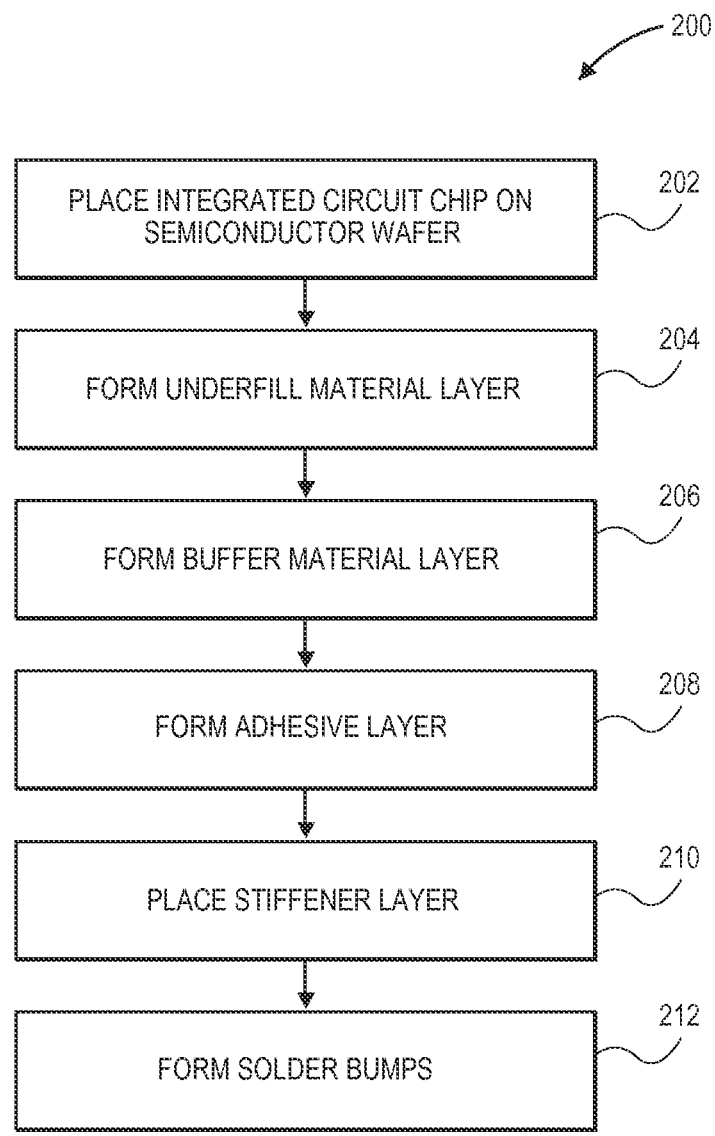
FIG. 2 is a flow diagram illustrating a process in an example implementation for fabricating semiconductor devices, such as the device shown in FIG. 1.
Figure 3A:
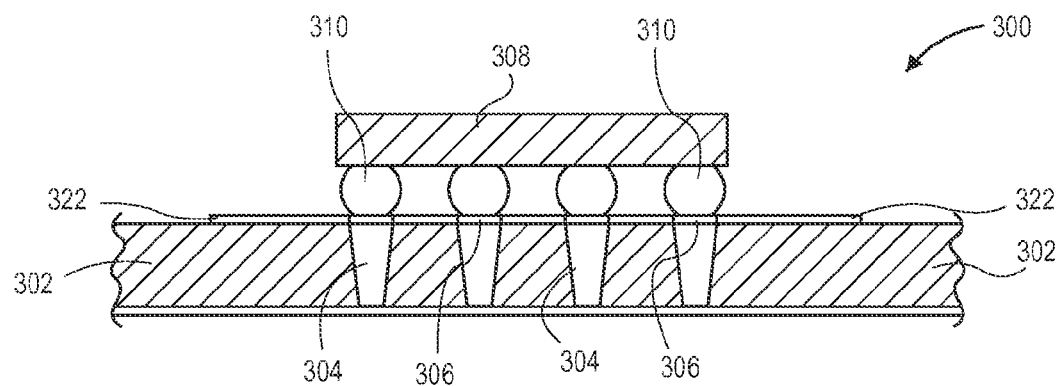
FIGS. 3A through 3E are diagrammatic partial cross-sectional views illustrating the fabrication of wafer-level packaged semiconductor devices, such as the semiconductor device shown in FIG. 1 according to the process shown in FIG. 2, in an example implementation.

FIG. 2 illustrates an example process 200 that employs wafer-level packaging techniques to fabricate three-dimensional semiconductor devices, such as the semiconductor device 100 shown in FIG. 1. FIGS. 3A through 3E illustrate sections of example wafers that may be utilized to fabricate semiconductor devices 300 (such as semiconductor device 100) shown in FIG. 1. A semiconductor wafer 302, as shown in FIG. 3A, includes a first surface (e.g., the top or frontside) and a second surface (e.g., the bottom or backside). The semiconductor wafer 302 includes one or more integrated circuits (not shown) formed proximate to the first surface. The integrated circuits are connected to one or more contact pads 306 (e.g., a metal pad, etc.) that are configured to provide electrical contacts through which the integrated circuits are interconnected to other components (e.g., other integrated circuits, printed circuit boards, other integrated circuit die, etc.) associated with semiconductor device 300. Additionally, the semiconductor wafer 302 includes at least one through-silicon via 304 formed therein and a dielectric layer 322 (e.g., an oxide layer) formed on at least one surface of the semiconductor wafer 302.

As illustrated in FIG. 3A, an integrated circuit chip is placed on a semiconductor wafer (Block 202). In some implementations, placing an integrated circuit chip 308 on the semiconductor wafer 302 may include utilizing a pick-and-place process. Pick-and-place technology may include using automated machines to place surface-mount devices (e.g., the integrated circuit chip device 308) onto a substrate (e.g., the semiconductor wafer 302). A pick-and-place process may place and align the integrated circuit chip 308 with electrical interconnections (e.g., contact pads 306) on the semiconductor wafer 302.

Figure 3B:
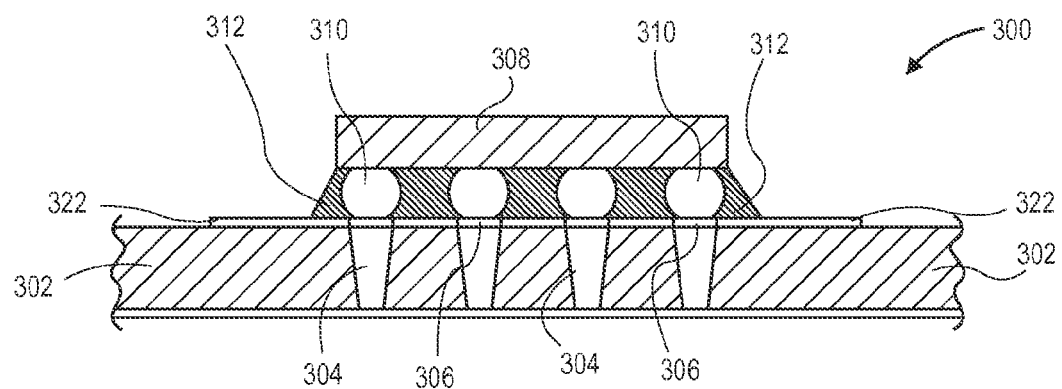
Figure 3C:
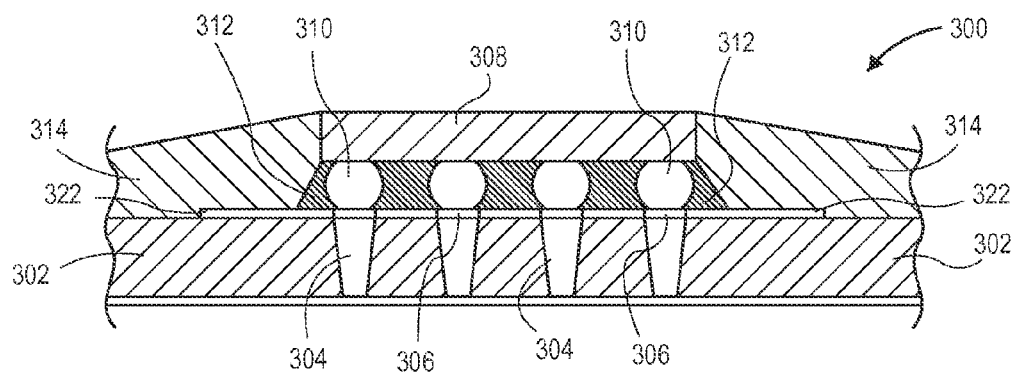

As illustrated in FIG. 3B, an underfill is formed (Block 204). In embodiments, forming an underfill 312 includes forming the underfill 312 between the integrated circuit chip 308 and the semiconductor wafer 302. In implementations, forming the underfill 312 may include using a process that utilizes capillary action to fill the remaining open space between the semiconductor wafer 302 and the integrated circuit chip 308. In an embodiment, the underfill 312 is applied in liquid form from a dispenser at one edge of the integrated circuit chip 308. In this embodiment, the underfill 312 then flows into the narrow gap between the solder bumps 310 because of capillary action and spreads across the integrated circuit chip 308 until the space between the integrated circuit chip 308 and the semiconductor wafer 302 is filled.

A buffer material is formed on the semiconductor device (Block 206). As illustrated in FIG. 3, a buffer material 314 is formed on the semiconductor wafer 302, the dielectric layer 322, a portion of the underfill 312, and at least one side of the integrated circuit chip 308. In an implementation, forming the buffer material 314 may include molding an epoxy-based material on the semiconductor wafer 302, the dielectric layer 322, a portion of the underfill 312, and at least one side of the integrated circuit chip 308 and curing the epoxy-based material. In one embodiment, forming the buffer material 314 may include using transfer molding because of its capability to mold small components with complex features.

Figure 3D:
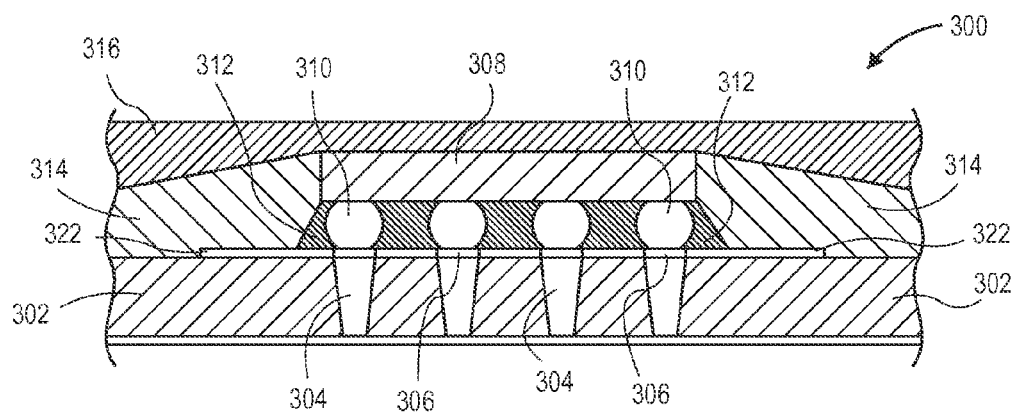

An adhesive layer is formed on the integrated circuit chip and the buffer material (Block 208). As illustrated in FIG. 3D, an adhesive 316 is formed on the integrated circuit chip 308 and the buffer material 314 to function as a bonding material between the semiconductor device 100 and a stiffener layer 318. Forming the adhesive 316 may include forming an adhesive material configured as an adhesive dielectric (e.g., benzocyclobutene (BCB), polyimide (PI), polybenzoxazole (PBO), etc.).

Figure 3E:
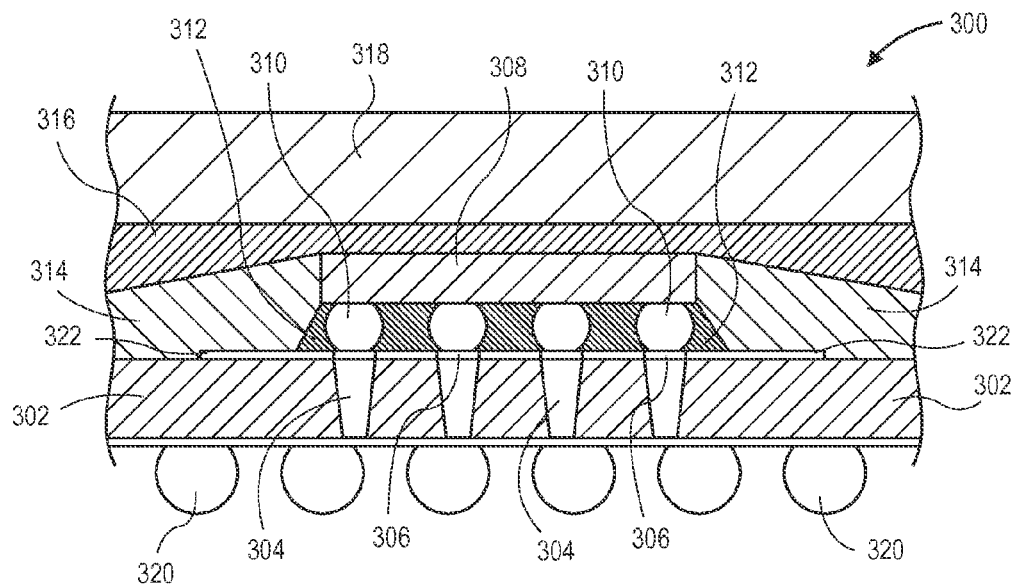

Next, a stiffener layer is placed on the adhesive (Block 210). As illustrated in FIG. 3E, placing the stiffener layer 318 includes placing the stiffener layer 318 on the adhesive 316. In an implementation, placing the stiffener layer 318 includes placing a silicon wafer on the adhesive. In another implementation, placing the stiffener layer 318 includes placing an alloy layer on the adhesive 316. It is contemplated that once the stiffener layer 318 is attached to the adhesive 316, a curing process may be utilized to further harden and/or cure the adhesive 316.

At least one solder bump is formed on the semiconductor wafer (Block 212). The solder bump(s) 320 may be formed using various methods. In one implementation, the solder bumps 320 are formed using a ball drop process. It is contemplated that other techniques such as solder paste printing, evaporation, electroplating, jetting, stud bumping, and so on may be used to form the solder bumps 320. In one implementation, forming solder bumps 320 includes applying solder paste to predetermined locations on the semiconductor wafer 302, the solder bumps 320 configured to be subsequently reflowed and form the final connections between the wafer level package device and another component (e.g., printed circuit board, other integrated circuit chip, etc.). In another embodiment, forming at least one solder bump includes dropping at least one solid, pre-formed solder ball using a ball drop process. In another embodiment, forming at least one solder bump 320 on the semiconductor wafer 302 includes placing a solder ball in a liquid or molten form on the semiconductor wafer 302. In these embodiments, the solder ball may be bonded to the semiconductor wafer 302 to form a solder bump 320 by heating the solder ball and the contact material.

Once the wafer fabrication process is complete, suitable wafer-level packaging processes may be employed to segment and package the individual semiconductor devices. In one or more implementations, the segmented semiconductor devices may comprise wafer chip-scale package devices.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A semiconductor device comprising:
    a processed semiconductor wafer, where the semiconductor wafer includes at least one via;
    a dielectric layer disposed on at least a portion of the semiconductor wafer;
    an integrated circuit chip coupled to the semiconductor wafer;
    an underfill layer disposed between the semiconductor wafer and the integrated circuit chip;
    a buffer material layer disposed on at least a portion of the dielectric layer, the underfill layer, and the semiconductor wafer, and covering at least a portion of the integrated circuit chip;
    an adhesive material disposed on the buffer material layer and the integrated circuit chip;
    a stiffener layer disposed on the adhesive material; and
    at least one solder bump formed on the processed semiconductor wafer.

2. The semiconductor device as recited in claim 1, wherein the processed semiconductor wafer comprises a processed ultra-thin semiconductor wafer.

3. The semiconductor device as recited in claim 1, wherein the processed semiconductor wafer comprises a wafer less than approximately 100 µm in thickness.

4. The semiconductor device as recited in claim 1, wherein the dielectric layer comprises an oxide layer.

5. The semiconductor device as recited in claim 1, wherein the buffer material layer comprises an epoxy based material.

6. The semiconductor device as recited in claim 1, wherein the buffer material layer comprises a buffer material layer that covers at least one side of the integrated circuit chip while leaving the side of the integrated circuit chip distal from the underfill layer exposed.

7. The semiconductor device as recited in claim 1, wherein the stiffener layer comprises a silicon wafer.

8. An electronic device comprising:
    a printed circuit board; and
    a semiconductor device coupled to the printed circuit board, the semiconductor device including
        a processed semiconductor wafer, where the semiconductor wafer includes at least one via;
        a dielectric layer disposed on at least a portion of the semiconductor wafer;
        an integrated circuit chip coupled to the semiconductor wafer;
        an underfill layer disposed between the semiconductor wafer and the integrated circuit chip;
        a buffer material layer disposed on at least a portion of the dielectric layer, the underfill layer, and the semiconductor wafer, and covering at least a portion of the integrated circuit chip;
        an adhesive material disposed on the buffer material layer and the integrated circuit chip;
        a stiffener layer disposed on the adhesive material; and
        at least one solder bump formed on the processed semiconductor wafer.

9. The electronic device as recited in claim 8, wherein the processed semiconductor wafer comprises a processed ultra-thin semiconductor wafer.

10. The electronic device as recited in claim 8, wherein the processed semiconductor wafer comprises a wafer less than approximately 100 µm in thickness.

11. The electronic device as recited in claim 8, wherein the dielectric layer comprises an oxide layer.

12. The electronic device as recited in claim 8, wherein the buffer material layer comprises an epoxy based material.

13. The electronic device as recited in claim 8, wherein the buffer material layer comprises a buffer material layer that covers at least one side of the integrated circuit chip while leaving the side of the integrated circuit chip distal from the underfill layer exposed.

14. The electronic device as recited in claim 8, wherein the stiffener layer comprises a silicon wafer.

15. A process comprising:
    placing an integrated circuit chip on a processed semiconductor wafer, where the semiconductor wafer includes at least one via and at least one dielectric layer;
    forming an underfill material layer between the integrated circuit chip and the semiconductor wafer;
    forming a buffer material layer on a portion of the underfill material layer, the dielectric layer, the semiconductor wafer, and adjacent to at least one side of the integrated circuit chip,
    forming an adhesive layer on the buffer material layer and a portion of the integrated circuit chip;
    placing a stiffener layer on the adhesive layer; and
    forming at least one solder bump on the semiconductor wafer.

16. The process as recited in claim 15, wherein placing an integrated circuit chip on a processed semiconductor wafer includes placing the integrated circuit chip on an ultra-thin semiconductor wafer.

17. The process as recited in claim 15, wherein placing an integrated circuit chip on a processed semiconductor wafer includes placing the integrated circuit chip on a wafer less than approximately 100 µm in thickness.

18. The process as recited in claim 15, wherein placing an integrated circuit chip on a processed semiconductor wafer includes a semiconductor wafer with at least one oxide layer on the surface of the semiconductor, and the oxide layer does not extend to the edge of the semiconductor device.

19. The process as recited in claim 15, wherein forming a buffer material layer on a portion of the underfill material layer includes forming a buffer material layer of an epoxy based material.

20. The process as recited in claim 15, wherein placing a stiffener layer on the adhesive layer includes placing a silicon wafer on the adhesive layer.

* * * * *